United States Patent [19]

Dillman

[11] Patent Number: 5,012,247
[45] Date of Patent: Apr. 30, 1991

[54] SWITCHED-CAPACITOR ANALOG-TO-DIGITAL CONVERTER WITH AUTOCALIBRATION

[75] Inventor: Norman G. Dillman, El Paso, Tex.
[73] Assignee: Hewlett-Packard Company, Palo Alto, Calif.
[21] Appl. No.: 274,104
[22] Filed: Nov. 21, 1988
[51] Int. Cl.⁵ .................. H03M 1/50; H03M 1/10
[52] U.S. Cl. .................. 341/172; 341/168; 341/120
[58] Field of Search ........... 341/172, 168, 166, 120, 341/167, 169, 170, 171

[56] References Cited

U.S. PATENT DOCUMENTS

| | | | |
|---|---|---|---|
| 4,144,526 | 3/1979 | Wotruba | 341/172 X |
| 4,357,600 | 11/1982 | Ressmeyer et al. | 341/129 |
| 4,529,965 | 7/1985 | Lee | 341/172 X |
| 4,764,753 | 8/1988 | Yukawa | 341/172 X |
| 4,907,002 | 3/1990 | Kawada | 341/172 |
| 4,908,620 | 3/1990 | Fujisawa | 341/172 X |
| 4,922,252 | 5/1990 | Draxelmayr et al. | 341/172 |

FOREIGN PATENT DOCUMENTS 0236218 10/1986 Japan .................. 341/172

Primary Examiner—J. R. Scott
Assistant Examiner—Sharon D. Logan

[57] ABSTRACT

The present invention provides a switched capacitor analog-to-digital converter for the sampling of an analog input signal and conversion to an equivalent digital format utilizing a multi-slope conversion technique. The elements comprising the converter are, preferably, integrated onto a single chip using CMOS technology. The converter includes a processor for coordinating switching in the converter and generating the digital output signal. A sampling circuit having a switched capacitor controlled by the processor is included in the converter for sampling the voltage of the analog input signal and transferring charge representative of the analog input signal between an integrator and the sampling circuit. Further included in the converter is a discharge circuit for either transferring charge to the integrator or receiving charge from the integrator. The discharge circuit is comprised of a number of switched capacitors having capacitances that are powers of two relative to one another to provide binary-weighted transfers between the discharge circuit and the integrator. Further, the processor can control, by using the switches, the direction of charge transfer using a single reference voltage. Further, the converter provides an autocalibration feature which compensates for deviation in the binary ratio of capacitances of the switched capacitors employed in the discharge circuit.

26 Claims, 8 Drawing Sheets

Fig. 3A  RUN-UP INTERVAL
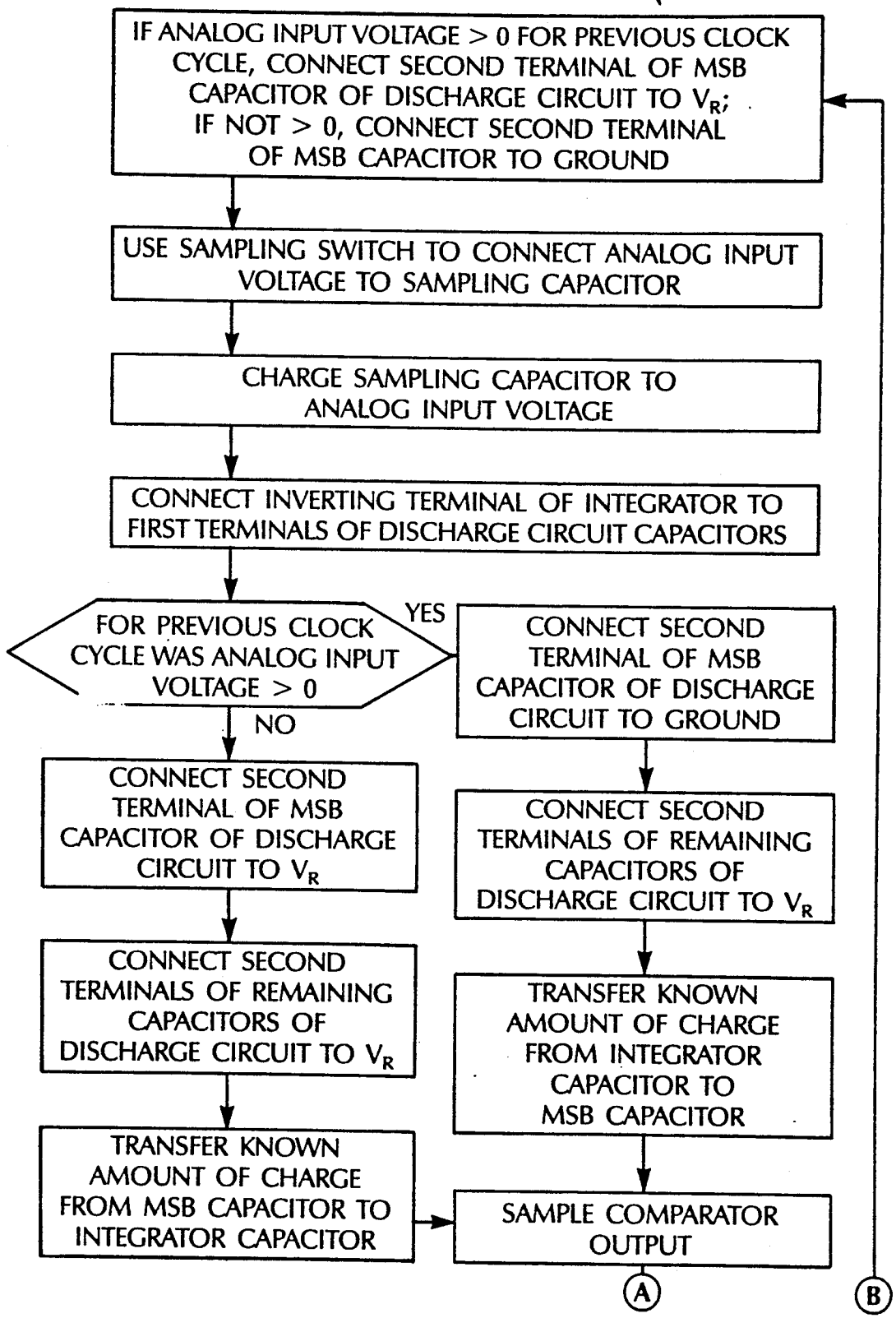

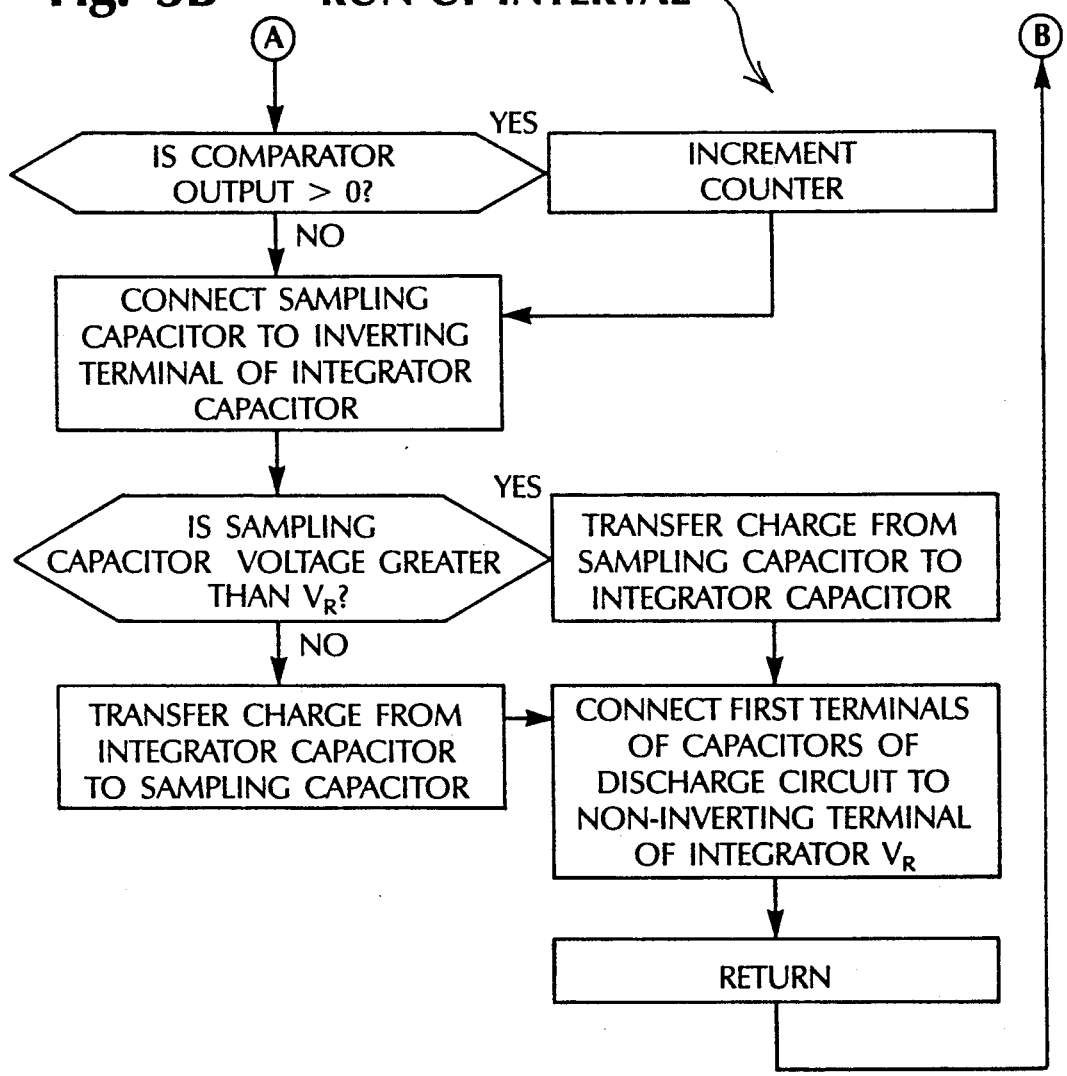
Fig. 3B RUN-UP INTERVAL

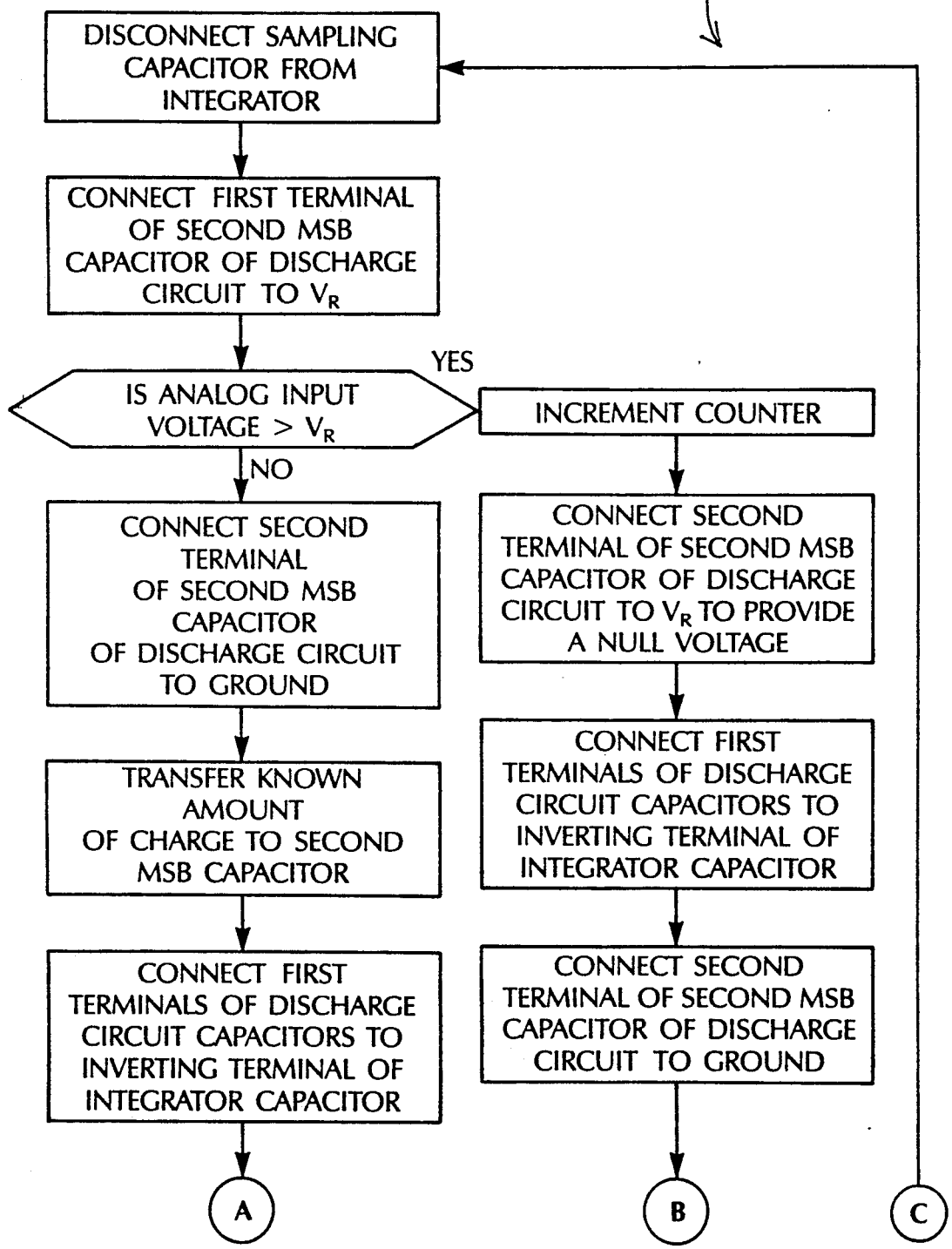

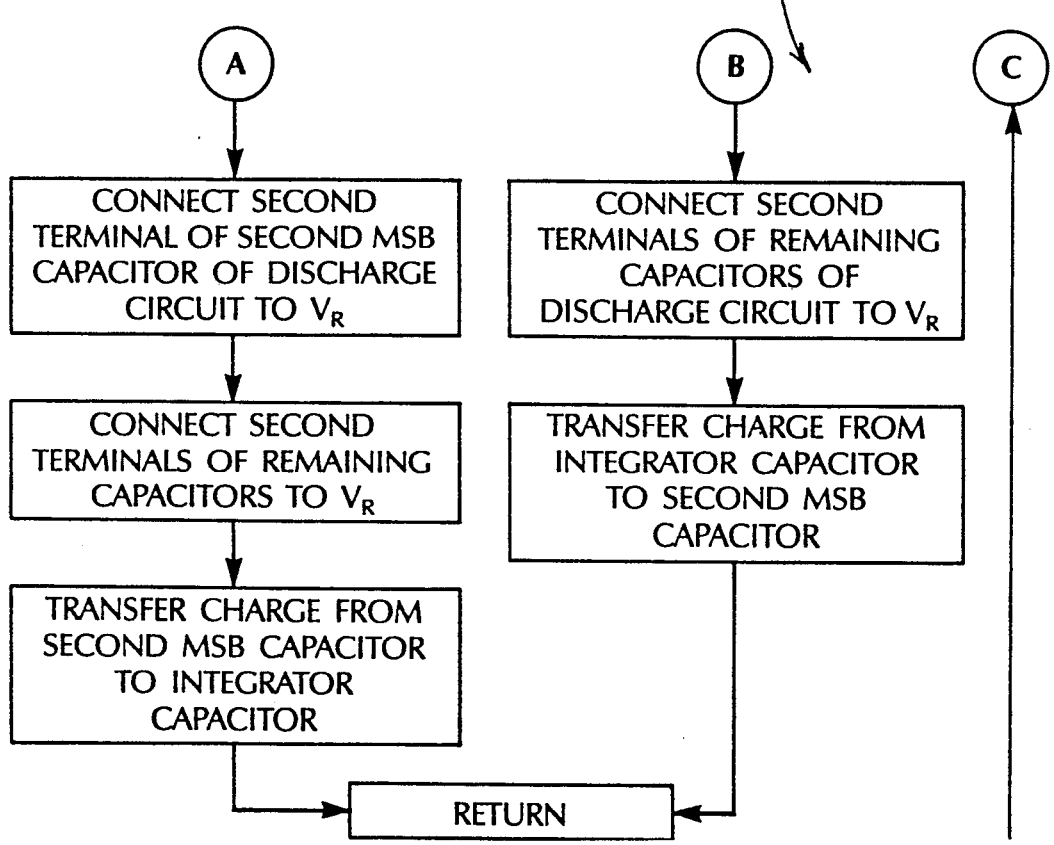

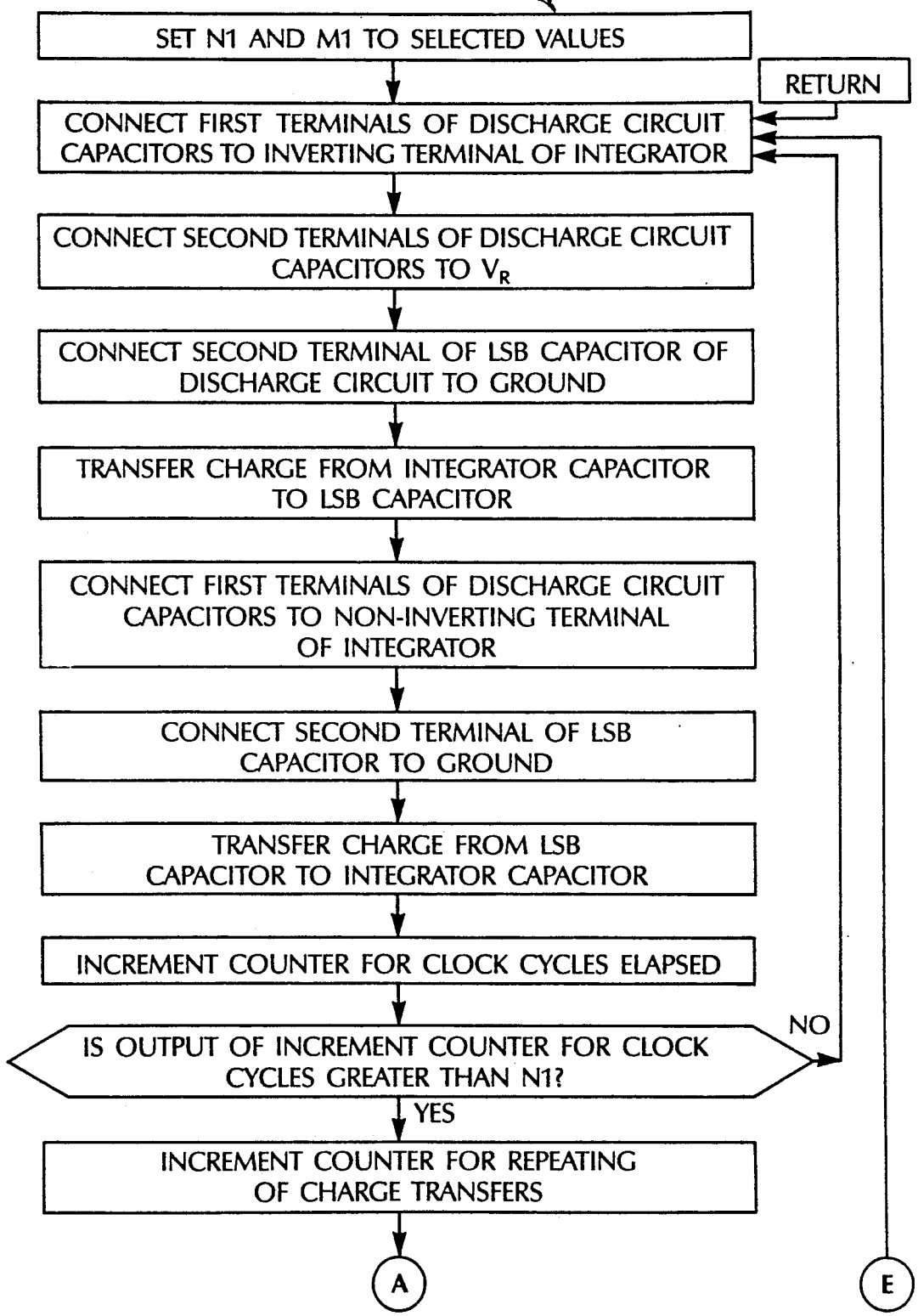
Fig. 5A CALIBRATION

SWITCHED-CAPACITOR ANALOG-TO-DIGITAL CONVERTER WITH AUTOCALIBRATION

FIELD OF THE INVENTION

The present invention relates to an analog-to-digital converter that utilizes switched capacitors to implement a multi-slope conversion technique.

DESCRIPTION OF THE PRIOR ART

Analog-to-digital converters operate to convert a sampled analog input signal to its equivalent digital representation. Typically, analog-to-digital converters are used to translate the analog signals produced by transducers and the like to a digital format that can be processed by a computer or other digital processor. By way of example, the analog-to-digital converter receives inputs from a photodiode array as part of an analytical instrument used in chromatographic analysis.

Several types of converters are available for performing analog-to-digital conversions. The choice of the analog-to-digital converter to utilize in a given application depends upon two parameters: resolution and reading rate. Resolution is determined by the number of bits in the resulting digital output signal. Reading rate is defined as the frequency within one cycle of which an analog-to-digital conversion can be made. One type of converter is the series converter which transforms the amplitude of the input signal to a frequency signal and then counts the cycles of the frequency signal to determine the digital representation of the input signal. A drawback inherent in the series converter is that one cycle of the frequency signal is required for each count. Consequently, using a frequency signal of 10 megahertz, it would take approximately 6 milliseconds to accumulate 16 bits of information. In other words, the series converter requires 65,536 counts of the 10 megahertz frequency signal to make an analog-to-digital conversion with 16-bit resolution. This translates to a relatively slow reading rate of 150 hertz. Another analog-to-digital converter is the flash or direct comparison converter which compares the input signal of unknown magnitude and polarity to several known reference signals simultaneously. Due to the simultaneous comparison, the flash converter exhibits a relatively high reading rate. However, with increasing resolution the complexity and, hence, expense of the flash converter increases. For example, to obtain 16 bits of resolution the flash converter requires 65,536 comparators. Other analog-to-digital converters utilize a successive approximation approach where the unknown magnitude of the analog input signal is compared to a known reference signal produced by a digital-to-analog converter. The first digital word input to the digital-to-analog converter to produce a known reference signal is a guess. If the guess is high with respect to the analog input signal then the second guess is reduced. If, on the other hand, the guess is low with respect to the analog input signal then the guess is increased. More specifically, the analog input signal is compared with a known reference signal in successive steps by first changing the most significant bit of the digital word input to the digital-to-analog converter and then proceeding to change the less significant bits until the closest possible approximation of the known reference signal to the analog input signal is achieved. Consequently, the successive approximation analog-to-digital converter provides a relatively high reading rate although less than that of the flash converter. However, successive approximation requires binary-weighted capacitors, resistors or other components for each bit. Consequently, for 16 bits of resolution, 16 components would be required with the largest component being $2^{16}$ or 65,536 times bigger than the smallest component.

Another type of analog-to-digital converter is the integrating converter. The integrating converter, in its simplest form, involves the application of an unknown analog voltage signal to the input of an integrator for a predetermined interval of time, known as a run-up interval. Prior to the run-up interval, the output of the integrator is at a predetermined level, typically zero. Following application of the unknown analog voltage signal to the input of the integrator for the defined run-up interval, the output of the integrator is at a voltage that represents the integral over time or the average value of the analog voltage signal over the run-up interval. The integrator typically consists of the well-known combination of a resistor, capacitor and operational amplifier. Notably, the resistor functions to convert the analog voltage signal to an analog current signal which charges the capacitor. Typically, conversion of the analog voltage signal to its equivalent digital representation occurs over a determinable amount of time, known as a run-down interval, where the output of the integrator is returned to its predetermined level, typically zero, by applying a known current to the integrator for a determinable amount of time. Initially, the output signal of the integrator produced at the end of the run-up period is applied to a comparator to determine the polarity of the known current signal to be applied to the integrator in order to return the output signal of the integrator to its predetermined level. The known current signal, typically achieved with a voltage source and resistor, is applied to the integrator for a determinable amount of time, the run-down interval. The determinable amount of time is the time between the beginning of the run-down interval and an indication, typically by a comparator, that the output of the integrator has been returned to its predetermined level. Notably, the slope of the integrator output signal during the run-down period is representative of the magnitude and polarity of the known current signal. Consequently, the application of the analog voltage signal to the integrator for the defined run-up period alters the integrator's output voltage from a known, predetermined level to an unknown level. The run-down interval, on the other hand, returns the integrator's output voltage from the unknown level established during the run-up period to its predetermined level over a predetermined period of time. Therefore, the product of the average analog current signal and the run-up period must equal the product of the known current signal and the run-down interval. Since the run-up period, the known current signal and the run-down interval are known, the value of the average analog current or voltage signal can be determined. Namely, the average value of the analog current signal is the ratio of the run-down interval to the run-up period multiplied by the known current signal. The digital conversion is accomplished by defining the known current signal to have a particular binary weight. For example, a particular known current signal may have a binary weight of $2^6$ or 64. The ratio of the run-down interval to the run-up period establishes the amount of binary weight to be accorded the average analog voltage signal. For example, if the ratio of the run-down interval to the run-up period is 3 to 64 and the known current signal has a binary weight of $2^6$, then the average analog voltage signal can be accorded a weight of 192. The integrating converter is capable of providing high resolution. However, high resolution requires a known current of relatively shallow slope which, in turn, increases the run-down interval necessary to reduce the output signal of the integrator to its predetermined level. Consequently, the simple integration or dual slope integration converter has a relatively low reading rate.

An improved integration converter, known as multi-slope integration converter, can improve the reading rate associated with the simple integration converter while maintaining high resolution. A multi-slope converter is disclosed in U.S. Pat. No. 4,357,600 to Ressmeyer et al., incorporated hereinafter by reference, and assigned to the assignee of the present invention, for a "Multi-Slope Converter and Conversion Technique". Ressmeyer et al. employs the typical integrator comprised of a resistor, a capacitor and an operational amplifier. The resistor functions, as previously described, to convert the analog voltage signal into a current which charges the capacitor during the run-up interval. The multi-slope converter, however, employs several known currents, having non-overlapping binary weights that cover the most significant bit to the least-significant-bit of the resulting digital output signal, to return the integrator to the predetermined level. The known currents, of both polarities, are generated by using a network of resistors and two reference voltages of opposite polarity. The most-significant-bit (msb) known current is of a considerably steeper slope than the slope associated with the least-significant-bit (lsb) known current. Consequently, application of the msb known current to the integrator results in a speedier return of the integrator output to its predetermined level and, hence, an improved reading rate. The reading rate can be further improved by applying a known current, generally the msb known current, to the integrator during the run-up interval thereby keeping the integrator output signal within a defined range at the end of the run-up interval. Resolution is still retained in the multi-slope integrator since it provides a lsb known current having a binary weight equivalent to that used in the simple integration analog-to-digital converter. Essentially, the multi-slope integration technique improves the reading rate without sacrificing resolution by reducing the time that the lsb known current needs to be applied to the integrator. This reduction in time is achieved by using the known currents with steeper slopes to quickly reduce the integrator output voltage to a level where the lsb known current need only be applied for a short time to return the integrator to the the predetermined level. In contrast, the simple integration analog-to-digital converter requires that only the lsb known current be applied to reduce the integrator output to its predetermined level. Since the lsb known current is of relatively shallow slope this can take a relatively long time thereby reducing the reading rate. A more detailed discussion of the multi-slope integration technique can be found in the above-cited patent.

The use of resistors in multi-slope integration analog-to-digital converters in certain situations presents problems. Typically, the resistors used in a multi-slope analog-to-digital converter are fabricated on a chip separate from the remaining circuitry so that the resistors can be trimmed to a high degree of tolerance. Consequently, a circuit board must be populated with at least two chips, one containing the resistors and the remaining chips containing the integrators and other components comprising the converter, in order to realize a multi-slope analog-to-digital converter with high precision resistors. The use of two or more chips to realize the multi-slope analog-to-digital converter requires external interconnections on a circuit board which occupies space that could be used to realize a higher chip density on the board, where a higher chip density is indicative of greater functionality per unit area of board. The number of chip interconnections also complicates and, hence, increases the expense of manufacturing the circuit board that supports the chips. Further, the external interconnections are exposed and, hence, susceptible to environmental conditions including thermal variations that may affect their integrity. Similarly, the chips themselves require surface area to provide connections between the internal circuitry and the external connection pins of the chip. Consequently, two chips occupy more surface area on the circuit board than a single chip incorporating the functionality of the two separate chips having internal interconnections. Therefore, the use of two or more chips to realize a multi-slope analog-to-digital converter with resistors reduces the chip density and, hence, the utility of the board. Further, an additional step in the fabrication process is required to trim the resistors thereby adding to the cost of realizing a multi-slope analog-to-digital converter. Consequently, there exists a need for a multi-slope analog-to-digital converter that, among other things, does not utilize resistors, occupies less board area than the present multi-slope analog-to-digital converters, exhibits a reduced chip count and is, in addition, less expensive and environmentally hardened.

Integration of resistors with other components of a multi-slope analog-to-digital converter onto a chip presents further difficulties. Namely, fabrication of resistors with other circuit element types, such as transistors, on a chip is difficult. Further, even if resistors are integrated onto a chip with other circuit components they can not, using conventional techniques, be easily trimmed without affecting the other circuit components. Consequently, there exists a further need for a multi-slope analog-to-digital converter with a reduced chip count and which does not utilize resistors.

The use of resistors in multi-slope analog-to-digital converters, whether implemented on a single chip, multiple chips or entirely as discrete elements, requires the use of at least two voltage sources having opposite polarities to generate currents of opposite polarity to either charge or discharge the integrator capacitor as required by the analog input signal. For example, if the integrator capacitor is negatively charged then a positive voltage source is required to establish a current through a resistor which adds positive charge to the integrating capacitor thereby promoting the return of the output of the integrator to its predetermined level. Similarly, if the integrating capacitor is positively charged, then a negative voltage source is required to establish a current through a resistor which adds negative charge to the integrating capacitor thereby returning the output of the integrator to its predetermined level. Therefore, there exists a need for a multi-slope analog-to-digital converter which does not require two voltage sources of opposite polarity for its operation.

Additionally, even if untrimmed resistors are integrated onto a single chip with other components comprising a multi-slope analog-to-digital converter the actual resistance of the resistors would vary considerably from their designated resistances. Any deviation in the resistance of the resistors could lead to an inaccurate analog-to-digital conversion since the resistors are determinative of the known currents employed to transfer specific amounts of charge that are, in turn, counted to determine the digital output signal. Consequently, there exists a need for a single chip, multi-slope analog-to-digital converter that is capable of compensating for deviations in the elements that determine the known currents or, alternatively, the specific amounts of charge transferred.

SUMMARY OF THE INVENTION

The present invention provides a switched capacitor analog-to-digital converter for sampling the unknown voltage of an analog signal and converting it to an equivalent digital format utilizing a multi-slope conversion technique. In one embodiment, the analog-to-digital converter receives analog voltage inputs developed as part of a chromatographic analysis for determining the identity of a number of components. The converter provides a digital output that is used by a computer to correlate and analyze the chromatographic-related data. The converter of the present invention is intended to reduce manufacturing costs and improve analytical instrument performance and reliability.

The preferred embodiment of the analog-to-digital converter includes a processor for coordinating switching in the converter and generating the digital output signal.

Further, the preferred converter includes a sampling circuit having a switched capacitor, controlled by the processor, for sampling the analog signal and transferring charge to or from an integrator. The processor can place the switched capacitor in one of two states. In the first state, the switched capacitor samples the unknown voltage of the analog input signal by charging to the value of the unknown voltage. In the second state, an amount of charge representative of the unknown voltage is transferred between the switched capacitor and an integrator. Consequently, the switched capacitor provides a charge transfer between the sampling circuit and the integrator thereby eliminating the need for a resistor to induce a current to transfer charge to the integrator.

The preferred embodiment further includes an integrator for generating an integrator signal representative of the integral over time of the sampled unknown analog input signal and a known discharge signal. The integrator is comprised of the well-known combination of an operational amplifier and a capacitor. The noninverting terminal of the operational amplifier is connected to a reference voltage. The non-inverting terminal and, hence, the reference voltage can also, under control of the processor, be connected to a discharge circuit in order to either charge or null a selected capacitor in the discharge circuit. The inverting terminal of the operational amplifier is connected to the sampling circuit so that, under control of the processor, a charge transfer indicative of the sampled unknown analog input signal can occur between the integrator and the sampling circuit. The processor can also connect the inverting terminal to the discharge circuit so that a known amount of charge, the discharge signal, can be transferred between the integrator and the discharge circuit. A capacitor connecting the output of the operational amplifier to the inverting terminal of the operational amplifier provides the integral over time of the sampled unknown analog input signal and the known discharge signal.

A comparator is included in the preferred converter for comparing the integral signal to the reference voltage and generating a comparator output signal indicative of whether the integrator signal exceeds the reference voltage or not. If the integrator signal is greater than the reference voltage then a logical "one" comparator output signal is generated, otherwise a logical "zero" comparator output signal is produced. The comparator output signal is applied to the processor which, in turn, uses the signal to control switches and determine the digital output signal.

Further included in the present invention is a discharge circuit having at least two, parallel, switched capacitors controlled by the processor for transferring known amounts of charge either to or from the integrator. The switched capacitors have capacitances that, preferably, vary by powers of two. Consequently, a switched capacitor can accommodate a known amount of charge that varies by a power of two from another switched capacitor for a given voltage. The direction of charge transfer is established by the comparator output signal and implemented by the processor toggling the appropriate switches. The transfer of a known amount of charge between a switched capacitor and the integrator is a two-step process.

First, one terminal of the selected switched capacitor, the one to or from which charge is to be transferred, is connected to the reference voltage associated with the non-inverting terminal of the operational amplifier in the integrator. The second terminal of the selected switched capacitor is connected to either ground or the reference voltage. If both terminals of the selected switched capacitor are connected to the reference voltage then the selected switched capacitor is nulled, i.e. no charge is established on it. In the subsequent step, this selected switched capacitor will receive a known, binary-weighted amount of charge from the integrator. If, on the other hand, the first terminal of the selected switched capacitor is connected to the reference voltage and the second terminal of the selected switched capacitor is grounded then the selected switched capacitor accommodates a known, binary-weighted amount of charge. In the subsequent step, this selected switched capacitor will transfer the binary-weighted amount of charge to the integrator.

Second, the known, binary-weighted amount of charge is transferred either from the selected switched capacitor to the integrator or from the integrator to the selected switched capacitor by toggling the switch connecting the second terminal of the selected switched capacitor to either ground or the reference voltage. If the selected switched capacitor was nulled in the first step then a known, binary-weighted amount of charge is transferred from the integrator to the selected switched capacitor. If, on the other hand, the selected switched capacitor was charged in the first step then a known, binary-weighted charge is transferred from the selected switched capacitor to the integrator. The non-selected switched capacitors are controlled by the processor such that they do not transfer charge and, in fact, isolate the charge transfer to the selected switched capacitor. Notably, the present invention achieves charge transfer in opposite directions utilizing a single reference voltage.

The switched capacitors utilized in the preferred embodiment of the converter are readily integrated with the processor onto a single semi-conductor chip using complementary metal oxide semi-conductor (CMOS) technology. It is also possible to integrate the switched capacitors onto a single semi-conductor chip with all of the other elements comprising the converter, however, performance is reduced.

Operation of the preferred embodiment of the converter includes a run-up interval characterized by the sampling of the analog input signal and a run-down interval during which the analog signal is not sampled.

The run-up interval lasts a defined number of clock cycles and is characterized by the sampling and integration of the unknown analog input signal. The switched capacitor in the sampling circuit, under control of the processor, is charged to the unknown voltage of the analog input signal during one-half of a clock cycle. During the second half of the clock cycle charge, indicative of the sampled analog input signal, is transferred between the switched capacitor of the sampling circuit and the integrator. Consequently, the sampled analog signal is integrated during the run-up interval. Preferably, the processor also determines the most-significant-bit or bits of the digital output signal during the run-up interval by effecting known charge transfers between the integrator and the most-significant-bit switched capacitor in the discharge circuit. The most-significant-bit switched capacitor in the discharge circuit has the largest capacitance and, hence, can transfer the largest amount of charge of any switched capacitor in the discharge circuit. The processor multiplexes the charge transfers between the sampling circuit and the discharge circuit to the integrator. Consequently, if the sampling circuit is sampling the analog input signal then there is a charge transfer occurring between the integrator and the discharge circuit. Conversely, if a charge transfer is occurring between the sampling circuit and the integrator then the selected switched capacitor in the discharge circuit is being charged or nulled. The length of the run-up interval depends upon the capacitance of the most-significant-bit switched capacitor and the number of bits of the digital output signal that need to be accumulated during the run-up interval. For example, if the most-significant-bit switched capacitor has a binary weight or capacitance of $2^{10}$ and the six most-significant-bits, $2^{10}$ through $2^{15}$, of the digital output signal are to be determined then the run-up interval must be 63 clock cycles in length.

The run-down interval lasts a defined number of clock cycles and is characterized by the analog signal no longer being sampled and integrated. In essence, the remaining bits of the digital output signal are determined by effecting charge transfers of known amounts between the remaining switched capacitors in the discharge circuit and the integrator. The switched capacitors are applied successively for defined periods of time, as with the most-significant-bit switched capacitor, to determine the remaining bits. For example, if the next largest switched capacitor relative to the most-significant-bit switched capacitor has a binary-weighted capacitance of $2^8$ then charge transfers must occur for three clock cycles to determine the next two most-significant-bits, $2^8$ and $2^9$. By transferring successively smaller amounts of charge a multi-slope conversion is realized.

The accuracy of the analog-to-digital conversion utilizing the present invention is subject to capacitor ratio errors. Consequently, an autocalibration feature is included in the present invention to correct for such errors. Notably, the autocalibration feature could also be employed with resistors. The autocalibration feature includes an auto-zeroing of the integrator, a determination of the fractional offset error associated with the least-significant-bit (lsb) switched capacitor of the discharge circuit and determination of calibration constants for the remaining switched capacitors in the discharge circuit. The auto-zero step results in an offset signal being applied to the integrator according to techniques that are well-known in the art to assure that the lsb switched capacitor in the discharge circuit can drive the integration signal to zero for charge transfers in either direction. In essence, the autozeroing of the integrator at least partially corrects for any imbalance in the positive and negative charge transfers between the discharge circuit and the integrator. Any remaining imbalance in the positive and negative charge transfers associated with the lsb switched capacitor of the discharge circuit are compensated for by determining the fractional offset error, which is an indication of the deviation from the expected charge transfer associated with the lsb switched capacitor. The fractional offset error of the lsb switched capacitor is then used to determine positive and negative error constants associated with, respectively, the positive and negative charge transfers of other switched capacitors in the discharge circuit. Consequently, the lsb switched capacitor acts as a reference from which the positive and negative error constants of the remaining switched capacitors are determined. The positive and negative error constants are then summed to obtain a calibration constant for each of the switched capacitors in the discharge circuit. The calibration constants are then used during analog-to-digital conversions to correctly weight the charge transfers that are used to generate the digital output signal.

Numerous advantages are realized by employing switched capacitors, as opposed to resistors, in the preferred embodiment of the present invention. Namely, capacitors are readily integrated with other components of a multi-slope analog-to-digital converter onto a chip. Consequently, the number of chips required to realize a multi-slope analog-to-digital converter on a printed circuit board is reduced. Further, by reducing the number of chips on a printed circuit board the functionality per unit area of the printed circuit board is increased. Additionally, for a given function, analog-to-digital conversion, the number of interconnections required on the printed circuit board is reduced and the potential reliability thereby increased. Concomitantly, the cost of manufacturing the printed circuit board is also reduced. Further, an analog-to-digital converter that uses fewer chips is less susceptible to environmental conditions that may effect its integrity. Also, by reducing the chip count of the multi-slope analog-to-digital converter the surface area required to connect the internal circuitry to the external pins is reduced thereby increasing the functionality of the chip per unit area. The use of switched capacitors also reduces the cost of realizing a multi-slope analog-to-digital converter by eliminating the trimming step required in the manufacture of the multi-slope analog-to-digital converters that utilize resistors. Switched capacitors further eliminate the need for two voltage sources of opposite polarity to achieve positive and negative charge transfers. The present invention advantageously utilizes a single reference voltage to achieve both positive and negative charge transfers. Consequently, the present invention is less complex and less expensive than multi-slope analog-to-digital converters that utilize two voltage sources of opposite polarity. The present invention also provides an autocalibration feature which compensates for any deviation in the designed capacitance or resistance of, respectively, the capacitors and resistors employed in the multi-slope analog-to-digital converter. As a result of the autocalibration feature, the accuracy of the digital output signal produced by the multi-slope analog-to-digital converter is increased.

BRIEF DESCRIPTION OF THE DRAWINGS

FIGS. 3A–3B are flow diagrams of the run-up interval utilized in determining digital bits representative of an inputted analog voltage signal;

FIGS. 4A–4B are flow diagrams of a run-down interval utilized in determining digital bits representative of an inputted analog voltage signal; and FIGS. 5A–5C are flow diagrams of steps executed by the processor of the present invention in conducting the automatic calibration of the switched capacitors.

DETAILED DESCRIPTION OF A PREFERRED EMBODIMENT

Figure 1:
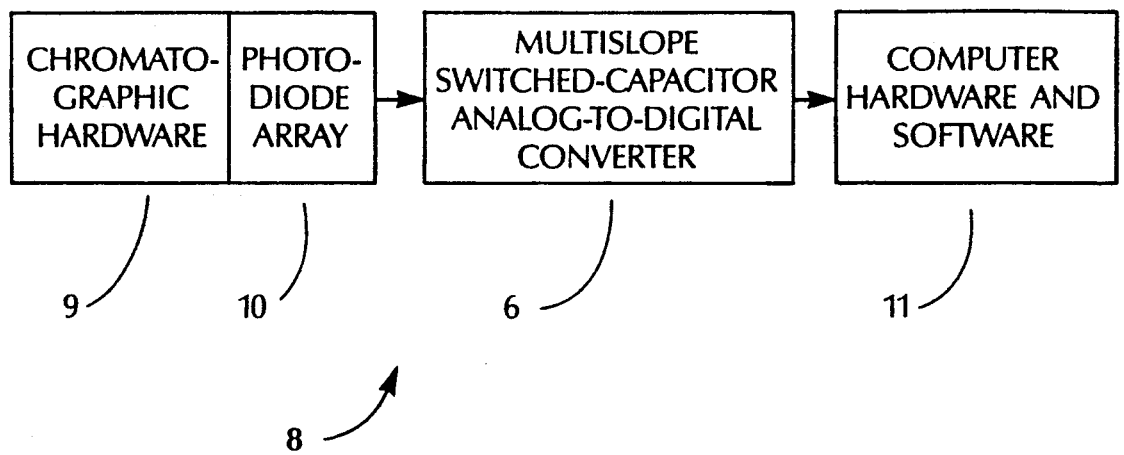
FIG. 1 is a block diagram of an analytical instrument incorporating the analog-to-digital converter of the present invention.

In accordance with the present invention, a multi-slope switched-capacitor analog-to-digital converter is provided for converting analog signals, typically produced by transducers and the like, into a digital format that is suitable for digital processing. Such converters have widespread applications. With reference to FIG. 1, one application of the present invention is illustrated. The multi-slope switched-capacitor analog-to-digital converter 6 is part of an analytical instrument 8 used to provide chromatographic analysis. Such analysis is performed to identify or determine the components of a multi-component substance or material. The analytical instrument 8 is comprised of chromatographic hardware 9, which includes a photodiode array 10. The photodiode array 10 develops an analog voltage signal which is inputted to the switched-capacitor A/D converter 6. The converter 6, which will be described in great detail subsequently herein, converts the changing analog voltage signal to the digital format for processing by the computer hardware and software 11. The computer hardware and software 11 typically correlates and otherwise analyzes the digital data associated with the chromatographic analysis received from the converter 6. The computer hardware and software 11 may comprise a physically separate supervisory computer or may be contained in the housing of the analytical instrument 8. The converter 6 can be used in a variety of applications and its incorporation in any application is intended to reduce the manufacturing cost relating to the implementation of the apparatus having the converter 6 as well as improve the reliability of the results obtained from such apparatus.

Analog-to-digital converters are characterized by their resolutions, reading rates and the type of technique employed to make the analog-to-digital conversion. Resolution is determined by the number of bits in the resulting digital output signal. The reading rate is the frequency at which the analog-to-digital converter makes conversions. Alternatively, the reading rate is the inverse of the time required to make an analog-to-digital conversion. The type of analog-to-digital converter used in a given application typically presents trade-offs between resolution and reading rate. Exemplary of trade-offs is the flash or direct converter which provides a high reading rate but becomes increasing complex, and therefore expensive, with increasing resolution. The series converter, on the other hand, is capable of providing high resolution but at a relatively low reading rate. Intermediate the flash and series converter is the multi-slope converter which is capable of providing a relatively high resolution and reading rate. The preferred embodiment of the present invention provides a multi-slope analog-to-digital converter having 16-bit resolution and a reading rate of approximately 50 kHz. Further, unless otherwise specified, the following elements comprising the preferred embodiment of the multi-slope analog-to-digital converter are integrated onto a single chip using complementary metal oxide semi-conductor (CMOS) technology.

Figure 2:
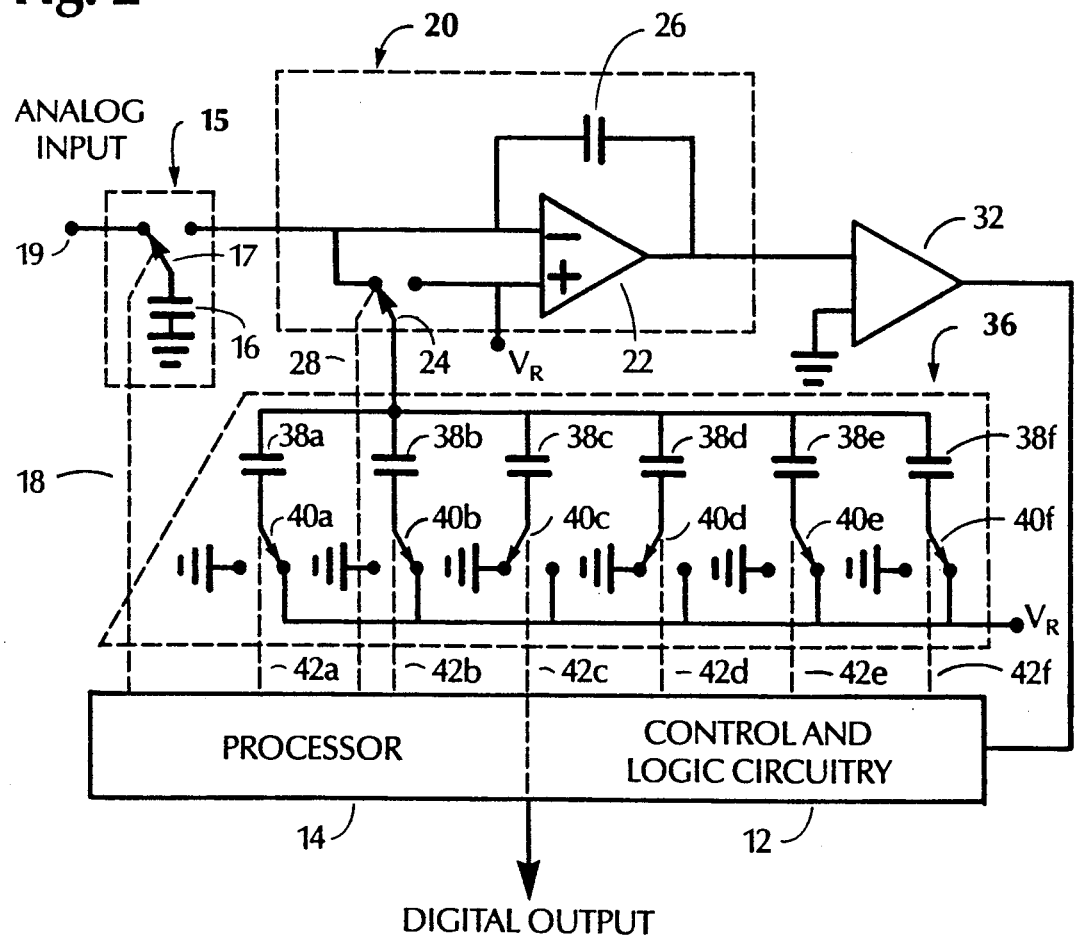
FIG. 2 is a circuit schematic of a switched-capacitor analog-to-digital converter.

The preferred embodiment of the multi-slope switched-capacitor analog-to-digital converter 6, hereinafter converter 6, that implements the multi-slope conversion technique is illustrated in FIG. 2. Included in the converter 6 is a processor 14 that provides switching control and generates the digital output signal that is representative of an analog input signal. The processor 14 is comprised of a clock control and logic circuitry 12. The clock having a frequency of, preferably, 10 MHz provides a clock signal that is used to coordinate the operation of the converter 6. The control and logic circuitry 12, as more fully described hereinafter, provides switching control in response to a comparator signal and generates the digital output signal. Tasks or steps implemented by such circuitry 12 are illustrated in the flow diagrams of FIGS. 3-5, which will also be discussed later.

The converter 6 includes a sampling circuit 15 for sampling the voltage of the analog input signal during a run-up interval. The run-up interval is defined as the portion of the total time necessary to make an analog-to-digital conversion during which the analog input signal is integrated. The sampling circuit 15 is comprised of a sampling capacitor 16 and a sampling switch 17. One terminal of the sampling capacitor 15 is grounded while the other terminal is connected to the sampling switch 17. The processor 14 utilizes a sampling control line 18 to place the sampling switch 17 in one of two states. In the first state the sampling switch 17 connects an input terminal 19 to the sampling capacitor 16 thereby allowing the analog input signal to be sampled. When the sampling switch is in the first state the sampling capacitor 16 becomes charged to an extent that reflects the magnitude and polarity of the analog input signal. In the second state the sampling switch 17 connects the sampling capacitor 16 to the inverting terminal of an operational amplifier 22 that forms a portion of an integrator used in the converter 6. When the sampling switch 17 is in the second state charge can be transferred between the switching capacitor 16 and the integrator. The sampling switch 17 is in one embodiment, a transistor, whose operation is controlled by the processor 14. Notably, the sampling circuit effects charge transfers with an integrator without using a resistor to convert the analog input signal to an analogous current signal.

Also included in the converter 6 is an integrator 20 for generating an integrator output signal that represents the integral over time of an integrator input signal comprised of the sampled analog input signal produced by the sampling circuit 15 and a discharge signal produced by a discharge circuit. The integrator 20 is, for simplicity, not located on the chip but would be in a fully integrated implementation. The integrator 20 is comprised of an integrator operational amplifier 22, an integrator switch 24 and an integrator capacitor 26. The non-inverting input of the integrator operational amplifier 22 is connected to a reference voltage $V_R$ of, preferably, the chip supply voltage $V_s$ divided by two. The processor 14 utilizes an integrator control line 28 to place the integrator switch 24 in one of two states. In the first state the non-inverting terminal of the integrator operational amplifier 22 and, hence, the reference voltage $V_R$ are connected to the discharge circuit. Connection of the reference voltage $V_R$ to the discharge circuit, as more fully explained hereinafter, allows capacitors within the discharge circuit to be charged to the reference voltage $V_R$ or nulled. In the second state the inverting terminal of the integrator operational amplifier 22 is connected to the discharge circuit thereby providing the discharge signal portion of the integrator input signal to the integrator 20. Like the sampling switch 17, the integrator switch 24 could be comprised of a transistor, whose switching is controlled by the processor 14. The sampled analog input signal portion of the integrator input signal is input to the integrator 20 by the processor 14 utilizing the sampling control line 18 and the sampling switch 17 to connect the inverting terminal of the integrator operational amplifier 22 to the sampling circuit 15. The sampled analog input signal is the charge transferred between the sampling capacitor 16 and the integrator 20. The integrator capacitor 26 connects the inverting terminal of the integrator operational amplifier 22 to the output of the integrator operational amplifier 22 thereby providing an integrator output signal that is the integral over time of the integrator input signal.

Also included in the converter 6 is a comparator 32 for comparing the integrator output signal to, preferably, the reference voltage $V_R$ and generating a comparator output signal indicative of whether the integrator output signal is greater than or less than the reference voltage $V_R$. For example, if the integrator output signal exceeds the reference voltage $V_R$ then the comparator 32 generates a logical "one" comparator output signal. Conversely, if the integrator output signal is less than the reference voltage $V_R$ then the comparator 32 generates a logical "zero" comparator output signal. The comparator output signal is updated at the start of a clock cycle and maintained throughout the cycle. The comparator output signal is used by processor 14, in turn, to properly sequence switches included in the converter 6 and to determine the digital output signal. The comparator 32 is, for simplicity, not located on the chip but would be in a fully integrated implementation.

The converter 6 further includes a discharge circuit 36, also controlled by the processor 14, for either generating known amounts of charge that are transferred to the integrator 20 or receiving known amounts of charge from the integrator 20. The discharge circuit 36 is comprised of circuit elements or charge transfer devices, such as discharge capacitors 38a-38f, and corresponding discharge switches 40a-40f. In one embodiment, each of the discharge switches 40a-40f is a transistor, which is turned on or off by the processor 14. Discharge capacitor 38f has a capacitance that relates to the least-significant-bit of the resulting digital output signal. The remaining discharge capacitors 38e-38a have, preferably, binary-weighted capacitances that increase, respectively, by powers of two. For example, the discharge capacitor 38e has a capacitance that is $2^2$ or 4 times that of capacitor 38f. Consequently, the discharge capacitor 38e can accomodate $2^2$ or 4 times more charge than capacitor 38f for a given voltage. The discharge capacitors 38d-38a having capacitance that are, respectively, $2^4$, $2^6$, $2^8$ and $2^{10}$ times that of the discharge capacitor 38f. The discharge capacitor 38a and the sampling capacitor 16 are, preferably, of the same capacitance. The discharge capacitors 38a-38f and their respective discharge switches 40a-40f are connected in parallel. The first terminal of each of the discharge capacitors 38a-38f is connected by a common buss to the integrator switch 24. Consequently, the processor 14 can can connect the first terminals of the discharge capacitors 38a-38f to the reference voltage $V_R$ associated with the non-inverting terminal of the integrator operation amplifier 22 using control integrator switch 24 and the integrator control line 28. Alternatively, the processor 14 can connect the first terminals of the discharge capacitors 38a-38f to the inverting terminal of the integrator operational amplifier 22 thereby providing a path for a discharge signal. The processor 14 utilizes discharge control lines 42a-42f to place, respectively, discharge switches 40a-40f in one of two states. In the first state the second terminal of a discharge capacitor is connected to ground. In the second state the second terminal of a discharge capacitor is connected to the reference voltage $V_R$.

In operation the discharge circuit 36 transfers a known amount of charge from one of the discharge capacitors 38a-38f to the integrator 20 or receives a known amount of charge from the integrator 20 on one of the discharge capacitors 38a-38f. The direction of charge transfer is determined by the polarity of the comparator signal and implemented by the processor 14 controlling the integrator switch 24 and the discharge switches 40a-40f. For example, a logical "one" comparator output signal, indicating that the integrator output signal exceeds the reference voltage $V_R$, would require that charge be transferred from the integrator 20 to the discharge circuit 36.

The transfer of charge to or from the discharge circuit 36 is a two-state operation. In the first state, the processor 14 utilizes integrator switch 24 and integrator control line 28 to connect the first terminals of the discharge capacitors 38a-38f to the reference voltage $V_R$. The processor 14 simultaneously uses a discharge control line and an associated discharge switch to connect the second terminal of a selected discharge capacitor, the capacitor to or from which a known charge is to be transferred depending upon the state of the comparator signal, to either ground or the voltage reference $V_R$. If the second terminal of the selected discharge capacitor is connected to ground then a known amount of charge, as determined by the reference voltage $V_R$ and the capacitance of the selected discharge capacitor, is established on the selected discharge capacitor. The charge established on the selected discharge capacitor is, in the second state, transferred from the discharge circuit 36 to the integrator 20. On the other hand, if the second terminal of the selected discharge capacitor is connected to the reference voltage $V_R$ then a null charge is established on the selected discharge capacitor. In the subsequent state the selected discharge capacitor will receive charge from the integrator capacitor 20. The processor 14 connects the second terminals of the remaining non-selected discharge capacitors to the voltage reference $V_R$ using the appropriate discharge switches and discharge control lines. Consequently, the non-selected discharge capacitors are nulled.

In the second state the processor 14 employs the integrator switch 24 and the integrator control line 28 to connect the first terminals of the discharge capacitors 38a–38f to the inverting terminal of the integrator operational amplifier 22 thereby providing a path for the transfer of charge between the discharge circuit 36 to the integrator capacitor 20. In addition, the processor 14 simultaneously toggles the switch associated with the selected discharge capacitor. Consequently, if the second terminal of the selected discharge capacitor were connected to ground in the first state then it is connected to the reference voltage $V_R$ in the second state. In this instance the status of the switches combine to produce a potential imbalance that results in known amount of charge being transferred from the selected discharge capacitor to the integrator 20. The potential imbalance results from the reference voltage $V_R$ at the non-inverting terminal of the integrator operational amplifier 22, the voltage across the selected capacitor and the reference voltage $V_R$ associated with the selected discharge capacitor violating Kirchoff's Voltage Law (KVL). On the other hand, if the second terminal of the selected discharge capacitor was connected to the reference voltage $V_R$ in the first state then it is connected to ground in the second state. Similarly, a known amount of charge is transferred from the integrator 20 to the selected capacitor due to a potential imbalance. The second terminals of the non-selected discharging capacitors remain connected to the reference voltage $V_R$ during the second state. Consequently, the reference voltage associated with the second terminals of the non-selected discharge capacitors is balanced by the reference voltage $V_R$ associated with the non-inverting terminal of the operational amplifier 22 thereby inhibiting any charge transfer to or from the non-selected capacitors and isolating any charge transfer to the selected capacitor.

Having described the various elements comprising the converter 6 and their interconnection, it is now necessary to describe the operation of the converter 6 with reference to FIGS. 3A–3B and 4A–4B. The operation of the converter 6 can be broken down into three steps. The first step is autocalibration of the discharge capacitors 38a–38f. Autocalibration can be performed before each analog-to-digital conversion, however, it is generally sufficient to autocalibrate the converter 6 once at the onset of operation. The second step in performing an analog-to-digital conversion is the run-up interval which is characterized by the sampling and integration of the analog input signal. The third step in an analog-to-digital conversion is the run-down interval during which the analog input signal is no longer sampled. At the end of the run-down interval the converter 6 provides a digital output signal representative of the sampled analog input signal. While the auto-calibration step should logically be described first, the run-up and run-down intervals associated with an analog-to-digital conversion will be described first since they provide a simplified framework upon which the autocalibration step can be described.

The run-up interval lasts 63 clock cycles and results in the sampling and integration of the analog input signal. Further, the most-significant bit (msb) discharge capacitor 38a is employed during the run-up interval to determine the six most-significant-bits of the digital output signal. The operation of the converter 6 during the run-up interval is best understood by describing the operation of the constituent components during the first and second halves of a clock cycle. During the first half of a clock cycle the processor 14 causes the sampling capacitor 16 to charge to a voltage that is indicative of the magnitude and polarity of the analog input signal by employing the sampling control line 18 to connect the sampling switch 17 to the input terminal 16. Also, during the first half of a clock cycle, the processor 14 uses the integrator control line 28 to connect the discharge circuit 36 to the inverting terminal of the integrator operational amplifier 22 by integrator switch 24. Consequently, a path is established for the transfer of a known amount of charge transfer either to or from the discharge circuit 36. Simultaneously, the processor 14 connects the second terminal of the msb discharge capacitor 38a to either ground or the reference voltage $V_R$ depending upon the direction of charge established by the comparator output signal existing at the beginning of the previous clock cycle. Once switching is completed, a potential imbalance occurs which results in a charge transfer either to or from the discharge circuit 36. The amount of charge transferred is defined by the capacitance of the msb discharge capacitor 38a and the reference voltage $V_R$ as is known in the art.

During the second half of a clock cycle the processor 14 utilizes the sampling control line 18 to connect the sampling capacitor 16 to the inverting terminal of the integrator operational amplifier 22 by the sampling switch 17. If the voltage established at the sampling capacitor 16 exceeds the reference voltage $V_R$ at the non-inverting terminal of the integrator operational amplifier 22 then the potential imbalance forces the sampling capacitor 16 to transfer charge to the integration capacitor 26. Conversely, if the voltage across the sampling capacitor 16 is less than the reference voltage $V_R$ at the non-inverting terminal of the integrator operation amplifier 22 then the potential imbalance results in the migration of charge from the integration capacitor 26 to the sampling capacitor 16. In addition, the processor 14 employs the integrator switch 24 and the integrator control line 28 to connect the discharge circuit 36 to the non-inverting terminal of the integration operational amplifier 22 and, hence, the reference voltage $V_R$. Further, the processor 14 utilizes the discharge switch 40a and the discharge control line 42a to connect the second terminal of the msb discharge capacitor 38a to either ground or the reference voltage $V_R$ based on the comparator output signal established at the beginning of the first half of the clock cycle. Consequently, if the comparator output signal indicates that the integrator output signal exceeds the reference voltage $V_R$ then the second terminal of the msb discharge capacitor 38a is connected to the reference voltage thereby nulling the msb discharge capacitor 38a. Therefore, when the discharge switch 40a is toggled during the first half of the subsequent clock cycle a known amount of charge can be transferred from the integrator capacitor 26 to the msb discharge capacitor 38a. If, on the other hand, the comparator output signal indicates that the integrator output signal is less than the reference voltage $V_R$ then the second terminal of the msb discharge capacitor 38a is connected to ground thereby charging the msb discharge capacitor 38a to the reference voltage $V_R$. The charge established on the msb discharge capacitor 38a is, during the first half of the subsequent clock cycle, transferred to the integrator capacitor 26. In addition, the processor 14 connects the second terminals of the remaining, non-selected discharge capacitors, 38b–38f, to the reference voltage $V_R$ for the entire 63 clock cycle run-up interval. Consequently, the remaining capacitors, 38b–38f, are nulled during the second half of a clock cycle and do not transfer or receive any charge during the first half of a clock cycle. This isolates any charge transfer to the msb discharge capacitor 38a. Therefore, during an entire clock cycle the charge transfer between the sampling circuit 15 and the integrator 20, and the discharge circuit 36 and the integrator 20 are multiplexed to avoid charge transfers between the sampling circuit 15 and the discharge circuit 36.

The process described with respect to the first and second halves of a clock cycle is repeated 63 times during the run-up interval to obtain the six most-significant-bits, $2^{10}$ through $2^{15}$, of the digital output signal. The processor 14 generates the six most-significant-bits of the digital output signal by sampling the comparator output signal once each clock cycle. If the comparator output signal is of a defined polarity, either a logical "one" or a logical "zero", the processor 14 counts it. If the comparator output signal is not of the defined polarity then it ignores it. Consequently, the processor 14 only counts charge transfers between the discharge circuit 36 and the integrator 20 in one direction. The count collected during the run-up interval and the known number of clock cycles or charge transfers, 63, provides the processor 14 with sufficient information to determine the six most-significant-bits of the digital output signal. For example, if there are 32 negative charge transfers then, given that there are 63 total charge transfers, there must be 31 positive charge transfers. By netting the positive and negative charge transfers, 1 in this example, the six most-significant-bits of the digital output signal can be determined.

The first charge transfer of msb discharge capacitor 38a during the run-down interval presents a possible source of error since the direction of charge transfer is dependent upon the comparator signal established during the previous clock cycle of the prior analog-to-digital conversion. Consequently, the first charge transfer may drive the integrator output signal away from rather than toward the reference voltage $V_R$. While this is a remote possibility, additional charge transfers, i.e. those in excess of the theoretical minimum number of charge transfers required to obtain the information, during either or both the run-up and run-down intervals can be used to correct the problem. The additional charge transfers occurring during the run-down interval result, during the netting of the positive and negative charge transfers, in a constant term that compensates for the charge transfers in excess of the theoretically required number of transfers.

The run-down interval proceeds to determine the ten least-significant-bits of the digital output signal by successively applying the discharge capacitors 38b–38f for three clock cycles each. The entire run-down interval lasts, preferably, 15 clock cycles. Notably, during the run-down interval the analog input signal is no longer being sampled. Consequently, the processor 14 utilizes the sampling control line 18 to connect the sampling capacitor 16 to the input terminal 16 by sampling switch 17 during the entire run-down interval. The processor 14 coordinates the operation of the integrator switch 24 and the digital switch associated with the selected discharge capacitor in a similar fashion to that employed with the most-significant-bit discharge capacitor 38a. For example, during the first half of a clock cycle, the integrator switch 24 connects the discharge circuit 36 to the non-inverting terminal of the integration operational amplifier 22 and, hence, to the reference voltage $V_R$. Further, the processor 14, based on a comparator signal generated at the beginning of the clock cycle, connects the second terminal of the discharge capacitor 38b to either ground or the reference voltage $V_R$ by utilizing the discharge control line 42b. If the discharge capacitor 38b is connected to ground then it charges to the reference voltage potential $V_R$. If, on the other hand, the discharge capacitor 38b is connected to the reference voltage then it is nulled. During the second half of a clock cycle, the integrator switch 24 connects the discharge circuit 36 to the inverting terminal of the integrator operational amplifier 22. Hence, a path between the integrator 20 and the discharge circuit 36 is established for charge transfer therebetween. Further, the processor 14 causes the discharge switch 40b to switch to the opposing terminal, either ground or the reference voltage, thereby effecting the proper charge transfer between the integrator 20 and the discharge circuit 36. Also, as previously described, the other discharge switches 40a and 40c–40f remain connected to the reference voltage $V_R$ during the second half of a clock cycle so as not to interfere with the charge transfer between the discharge capacitor 38b and the integration capacitor 26. The charge transfers between the discharge capacitor 38b and the integrator capacitor 26 continue for three clock cycles so that the processor 14 can acquire two bits of information, $2^8$ and $2^9$, based upon the polarity of comparator signal and the known number of clock cycles or charge transfers, three, as previously described. The discharge capacitors 38c–38f are successively applied by the processor 14 to acquire the less-significant-bits of information, $2^7$ through $2^0$. Notably, the capacitance of the discharge capacitors 38b–38f are one-quarter of the capacitance of the previously applied capacitor. Consequently, by applying the discharge capacitors 38b–38f each for three clock cycles to generate two bits of information per capacitor the bits $2^9$ through $2^0$ of the resulting digital output signal can be determined.

The converter 6 requires 78 clock cycles, 63 during run-up and 15 during run-down, to entirely convert an analog signal to a digital signal having 16 bits of resolution. However, due to delays in the comparator and logic associated with the processor 14 and the possible error associated with the first charge transfer of the msb discharge capacitor 38a, 104 clock cycles, 64 for run-up and 40 for run-down, are required to convert an analog signal to a digital signal with 16 bits of resolution. In this situation, 104 clock cycles for an analog-to-digital conversion with a 5 MHz clock produces a reading rate of approximately 50 kHz.

Figure 5B:
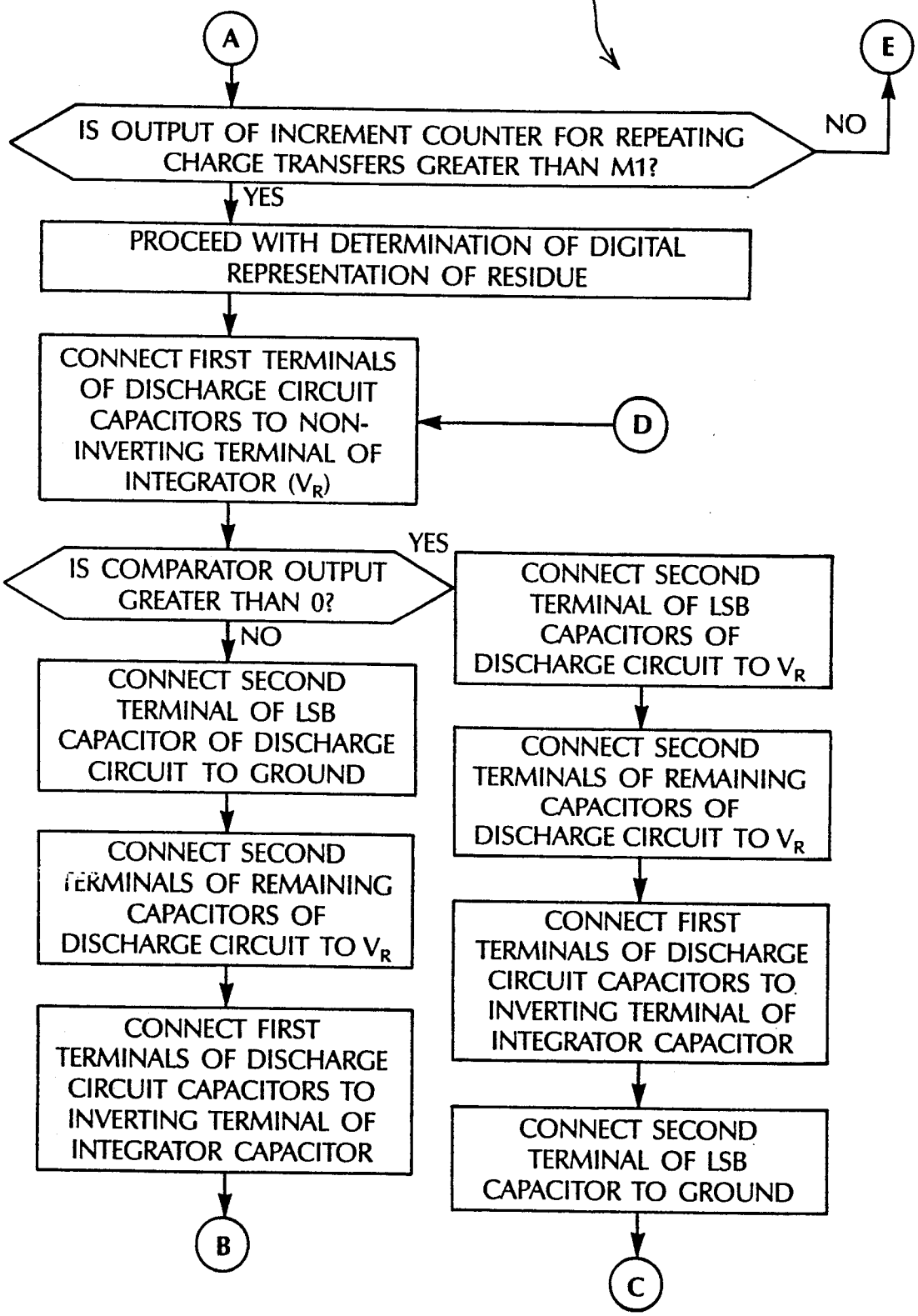
Figure 5C:
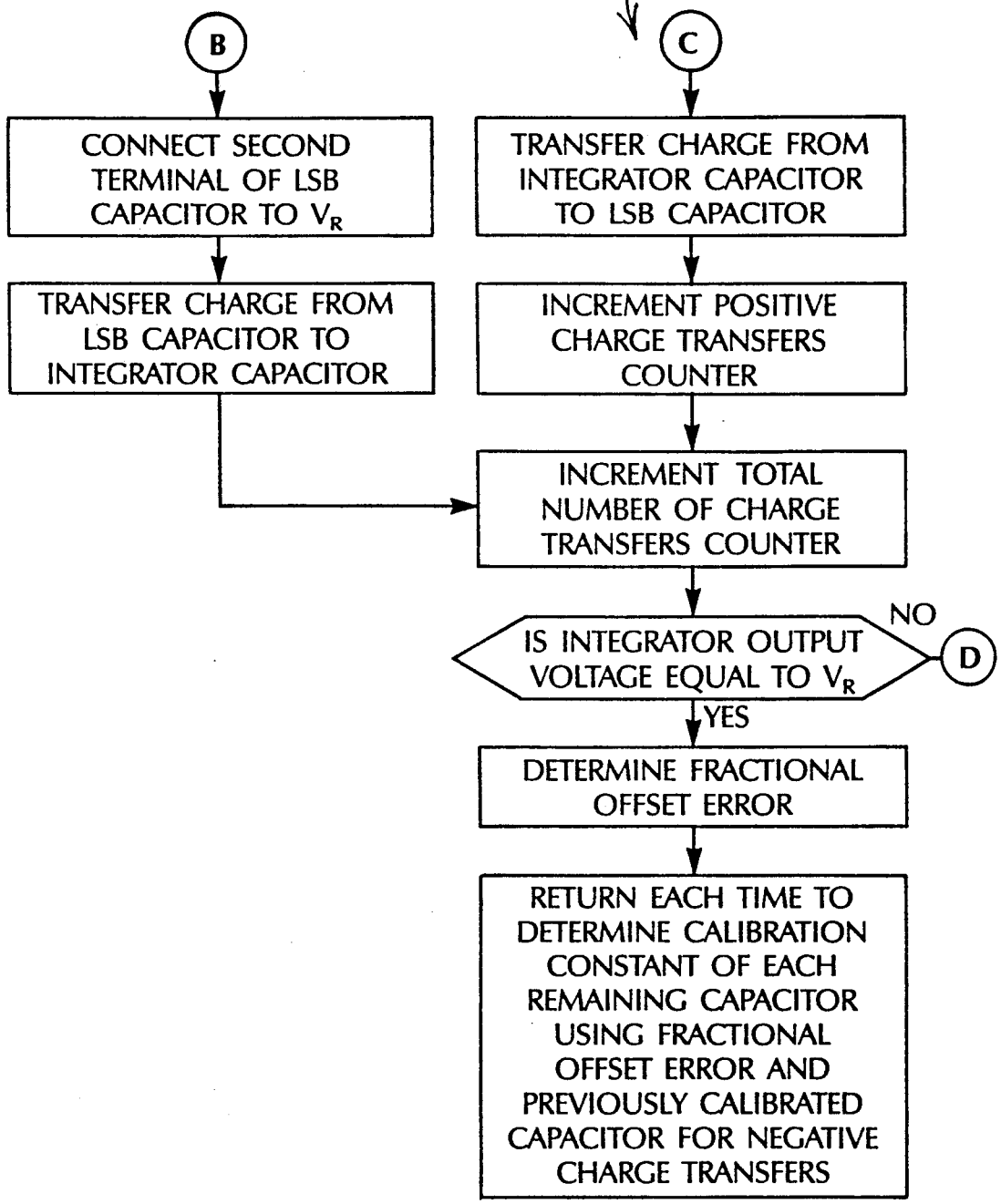

The accuracy of the analog-to-digital conversion described hereinabove with regard to the run-up and run-down intervals is subject to, among other things, discharge capacitor ratio errors. Specifically, any deviation from the prescribed 4 to 1 ratio can cause an overlap or underlap between the slopes that could, for a given analog input signal, produce more than one digital output signal. Consequently, the present invention includes an autocalibration feature which, among other things, calibrates each discharge capacitor associated with the converter 6. Reference is made to FIGS. 5A–5C which illustrate autocalibration steps that will now be discussed. Autocalibration could be performed prior to each analog-to-digital conversion, however, it is normally done on an extended, periodic basis. Autocalibration produces a calibration constant for each discharge capacitor. Consequently, the count associated with the charge transfers between a selected discharge capacitor and the integrator is accumulated during an analog-to-digital conversion is automatically corrected according to the correction factor established during autocalibration. More specifically, as each bit of the digital output signal is determined the corrected value rather than the designed or ideal binary value is used. Autocalibration is comprised of three steps.

First, the integrator 20 is auto-zeroed by applying an offset voltage to the integration operational amplifier 22 to assure that the least-significant-bit discharge capacitor 38f is capable of driving the integration signal to the reference voltage when transferring charge either to the integrator 20 or from the integrator 20. Auto-zeroing of the integrator 20 at least partially corrects for any imbalance in the positive and negative slopes, i.e. charge transfers to and from the integrator, thereby assuring that the least-significant-bit discharge capacitor 38f can produce an integration signal substantially equal to the reference voltage from either direction. In order to limit the imbalance in the least-significant-bit discharge capacitor 38f to 20 percent for a reference voltage $V_R$ of $-2.5$ volts, the offset must be less than 180 microvolts in the preferred embodiment. Auto-zeroing of the integrator 20 can be accomplished by any of several analog or digital techniques that are well-known in the art.

Second, the fractional offset error or deviation from the expected charge transfer associated with the least-significant-bit discharge capacitor 38f is determined. The fractional offset error is determined from the following formula:

$$M_1((1+d_1)N_1/2-(1-d_1)N_1/2) = (K_1-R_1)(1-d_1)-R_1(1+d_1) \quad (1)$$

The processor 14 implements the Equation (1) by effecting positive and negative charge transfer between the lsb discharge capacitor 38f and the integrator 20 to build up an integrator output signal or residue that is indicative of the imbalance in the positive and negative charge transfers. Since the imbalance is unknown, this step is similar to the integration of an unknown analog signal during the run-up interval. Once the residue is established, the processor 14 determines the digital representation of the residue by using the lsb discharge capacitor 38f to return the integrator output signal to the reference voltage. This step is similar to the rundown interval previously described. Once the digital representation is determined, there is sufficient information to determine the fractional offset error. More specifically, the left side of Equation (1) represents the accumulation of a residue on the integrator 20 that is indicative of the imbalance in positive and negative charge transfers associated with the least-significant-bit discharge capacitor 38f. Positive and negative charge transfers denote the direction of charge transfer between the discharge circuit 36 and the integrator 20. As such, $M_1$ represents a repetition factor, $d_1$ represents a fractional or incremental offset error, and $N_1$ represents the number of clock cycles associated with the residue accumulation phase. Therefore, the left side of Equation (1) represents $N_1/2$ positive charge transfers and $N_1/2$ negative charge transfers between the least-significant-bit discharge capacitor 38f and the integrator 20 repeated $M_1$ times for a total of $M_1N_1$ transfers. The imbalance in the positive and negative charge transfers is represented by the $(1+d_1)$ and $(1-d_1)$ factors. The positive and negative charge transfers are repeated $M_1N_1/2$ times each to incrementally build up the residue to a point where the fractional offset error can be determined with considerable accuracy. Consequently, the establishment of a residue on the integrator 20 using the least-significant-bit discharge capacitor 38f, as described by the left side of Equation (1), results in an unknown voltage, indicative of the imbalance in positive and negative charge transfers associated with the discharge capacitor 38f, being output by the integrator 20.

Similarly, the right side of Equation (1) represents the digital representation of the residue established by the repeated positive and negative charge transfers between the least-significant-bit discharge capacitor 38f and the integrator 20 as defined in the left side of Equation (1). As such, $R_1$ represents the count of positive charge transfers and $K_1$ represents the total number of charge transfers. Therefore, the right side of Equation (1) determines the digital representation of the residue by taking the difference between the number of positive and negative charge transfers. The number of negative charge transfers is the difference between the total number of charge transfers $K_1$ and the number of positive charge transfers $R_1$. Again, the imbalance between the positive and negative charge transfers is indicated, respectively, by the factors $(1+d_1)$ and $(1-d_1)$. Once the number of positive charge transfers $R_1$ is determined Equation (1) can be solved for the incremental or fractional offset error as follows:

$$d_1 = (K_1 - 2R_1)/(M_1N_1 + K_1) \quad (2)$$

Preferably, the factors comprising the denominator of Equation (2), i.e. $M_1$, $N_1$ and $K_1$, are chosen so that the denominator is a power of two. Thus, the determination of the fractional offset error by the processor 14 involves right shifting of the numerator term. Having determined the fractional or incremental offset error $d_1$ the calibration constants for the remaining discharge capacitors can be determined.

Third, the calibration constants associated with the remaining discharge capacitors 38a–38e can be determined using the fractional or incremental offset error $d_1$ determined in the prior step. The determination of calibration constants proceeds successively from the discharge capacitor 38e through the discharge capacitor 38a for reasons which will become apparent. The calibration constant for a particular discharge capacitor is the sum of the positive and negative error constants associated with, respectively, the positive and negative charge transfers of the particular discharge capacitor. For example, the positive error constant associated with the discharge capacitor 38e is determined according to the following equation:

$$M_2((4N_2)(1+e_{2p})-4(N_2)(1-d_1)) = -R_{2p}(1+d_1) + (K_2-R_{2p})(1-d_1) \quad (3)$$

The processor 14 implements Equation (3) by effecting positive charge transfer between the discharge capacitor 38e with the integrator 20 and negative charge transfers between the lsb discharge capacitor 38f and the integrator 20 to establish a residue that is indicative of the deviation of the positive charge transfer of the discharge capacitor 38e from the ideal value. Again, since the deviation is unknown, this step is similar to the integration of an analog input signal as previously described. Once the residue is established, the processor 14 determines the digital representation of the residue by using the lsb discharge capacitor 38f to return the integrator output signal to the reference voltage. Consequently, the discharge capacitor 38e is calibrated relative to the lsb discharge capacitor 38f. This step is similar to the run-down interval described previously. Once the digital representation is determined, there is sufficient information to determine the positive error constant. More specifically, the left side of Equation (3) represents the establishment of a residue that is indicative of the deviation of the positive charge transferred by the discharge capacitor 38e from the ideal value compared to the lsb slope. As such, $M_2$ represents a repetition factor and $N_2$ represents the number of clock cycles associated with the discharge capacitor 38e. Consequently, the left side of Equation (3) represents $N_2$ positive charge transfers and $4N_2$ negative charge transfers repeated $M_2$ times. The multiplication factor of four associated with the positive error constant indicates that the discharge capacitor 38e transfers four times the charge of the lsb discharge capacitor 38f. Notably, the positive charge transfers are achieved using the discharge capacitor 38e and the negative charge transfers are accomplished using the discharge capacitor 38f. By utilizing the discharge capacitor 38f to effect the negative charge transfers, the positive error constant associated with the discharge capacitor 38e is determined relative to the discharge capacitor 38f. Hence, the discharge capacitor 38f is the reference relative to which all of the other error constants, and ultimately the calibration constant, are determined. Further, since the discharge capacitor 38f is capable of transferring a fourth of the charge that the discharge capacitor 38e is capable of there are four times as many negative charge transfers as positive charge transfers in the left-hand side of Equation (3). This further explains the successive determinations of calibration constants since the determination of the calibration constant of any particular discharge capacitor utilizes the previously-calibrated discharge capacitor. The calibration of any particular discharge capacitor could use any previously-calibrated discharge capacitor, however, the use of the immediately previous discharge capacitor to accomplish the calibration results in a minimal number of charge transfers. The positive and negative charge transfers are repeated $M_2$ times in order to incrementally build up the residue to a point where the positive error constant can be determined with considerable accuracy.

Similarly, the right side of Equation (3) represents the digital representation of the residue established by the positive and negative charge transfers defined in the left side of Equation (3). As such, $R_{2p}$ represents the number of positive charge transfers and $K_2$ represents the total number of charge transfers. Notably, the positive and negative charge transfers necessary to dissipate the residue are determined using the previously-calibrated discharge capacitor 38f. The imbalance in the positive and negative charge transfers is indicated, respectively, by the $(1+d_1)$ and $(1-d_1)$ factors. Once $R_{2p}$ is determined Equation (3) can be solved for the positive error constant $e_{2p}$. In a similar fashion, the negative error constant associated with the discharge capacitor 38e is determined. The calibration constant associated with the discharge capacitor 38e is then determined by summing the positive and negative error constants as indicated in the following equation:

$$e_2 = e_{2p} + e_{2n} = \frac{(R_{2n} - R_{2p})}{2M_2N_2} \tag{4}$$

The factors comprising the denominator of Equation (4), preferably, combine to form a power of two. Thus, the calculation of the calibration constant $e_2$ by the processor 14 is a matter of right shifting the result of the difference that defines the numerator.

The calibration constant associated with the remaining capacitors 38d–38a is determined in a similar fashion and results in the following Equations (5) through (8):

$$e_3 = e_{3p} + e_{3n} = \frac{R_{3n} - R_{3p}}{8M_3N_3} + e_{2p} + e_{2n} \tag{5}$$

$$e_4 = e_{4p} + e_{4n} = \frac{R_{4n} - R_{4p}}{32M_4N_4} + e_{3p} + e_{3n} \tag{6}$$

$$e_5 = e_{5p} + e_{5n} = \frac{R_{5n} - R_{5p}}{128M_5N_5} + e_{4p} + e_{4n} \tag{7}$$

$$e_6 = e_{6p} + e_{6n} = \frac{R_{6n} - R_{6p}}{512M_6N_6} + e_{5p} + e_{5n} \tag{8}$$

The factors comprising the denominators of Equations (5)–(8) are chosen, as previously described, to facilitate the determination of the error constants.

The error coefficients are developed assuming that the total error per reading is a linear combination of the errors for each polarity of each slope and that the errors are not sequence dependent. Thus, the total error is characterized by the following Equation (9):

$$\text{Total Error} = (N_{ip} e_{ip} - N_{in} e_{in}) \tag{9}$$

where $N_{ip}$ and $N_{in}$ are the number of positive and negative charge transfers, and $e_{ip}$ and $e_{in}$ are the positive and negative errors per count. Since $N_{ip}$ and $N_{in}$ total a fixed number of total charge transfers the total error can be expressed as follows:

$$\text{Total Error} = N_{ip}(e_{ip} + e_{in}) - N_i e_{in} \tag{10}$$

The second term of Equation (10) is not reading dependent and hence produces a fixed offset. The first term of Equation (10) represents the variable error per reading and can be reduced to the following equation:

$$\text{Variable Error/Reading} = N_{ip} e_i \tag{11}$$

where $e_i$, as shown in the above equations, is the sum of $e_{ip}$ and $e_{in}$. Thus, by determining the $e_i$ associated with each of the discharge capacitors 38a–38f, as demonstrated hereinabove, the variable error can be reduced.

Once autocalibration is completed, the calibration coefficients are used to properly weight the counts produced during an analog-to-digital conversion of an analog input signal thereby reducing the error in the resulting digital output signal. More specifically, the error constants are added to the desired values and stored in a register or memory location within the processor 14. Thus, during the determination of any particular bit or bits of the digital representation of an analog signal the corrected value, stored in the register, is employed. For example, if the capacitance of the discharge capacitor 38e after calibration is 4.01 times that of the lsb capacitor 38f then the corrected value is used when the second and third bits of the digital word are determined. Consequently, the digital representation of the analog signal is automatically corrected as it is determined. Thus, the converter 6 eliminates the need for a correction step after each analog-to-digital conversion since the correction occurs automatically as the digital word is determined.

The present invention is susceptible to several modifications and variations without departing from the scope of the present invention Namely, the switched capacitors could be replaced by electrical or electronic elements which are capable of storing charge. Further, the resolution of the present invention can be manipulated by varying the number of discharge capacitors employed therein. Similarly, the reading rate can be adapted to varying situations by altering the number of clock cycles during which a particular discharge capacitor is utilized. Further, the 4 to 1 ratio of capacitances between consecutive discharge capacitors can be altered without departing from the scope of the present invention. For example, the capacitances of consecutive discharge capacitors could vary by a power of two other than 4. Another possibility is that the capacitances of consecutive discharge capacitors could vary by powers of a base other than base 2. For example, the capacitances could vary by powers of base 10. Concomitantly, any change in the ratio of the capacitances of consecutive discharge capacitors would also effect certain coefficients employed in the autocalibration of the present invention. It should also be understood that at least portions of the control and logic circuitry could be implemented using software and that the calculations made in calibrating the converter could be implemented using hardware and/or software. Similarly, the autocalibration techniques of the present invention could be utilized with circuit elements other than capacitors. As is well known in the art, the polarities and magnitudes of signals passed between various elements comprising the present invention can, with appropriate changes to the various elements, be altered without departing from the scope of the present invention. Further, the converter disclosed herein has widespread application and can be used with a variety of accompanying hardware and, even though it is illustrated as being part of an analytical instrument, its use is not limited thereto.

The foregoing description of the invention has been presented for purposes of illustration and description. Further, the description is not intended to limit the invention to the form disclosed therein. Consequently, variations and modifications commensurate with the above teachings, and the skill or knowledge in the relevant art are within the scope of the present invention. The preferred embodiment described hereinabove is further intended to explain the best mode known of practicing the invention and to enable others skilled in the art to utilize the invention in various embodiments and with the various modifications required by their particular applications or uses of the invention. It is intended that the appended claims be construed to include alternative embodiments to the extent permitted by the prior art.

What is claimed is:

1. An apparatus for providing an analog-to-digital conversion, comprising:
    sampling circuit means for receiving an analog signal;
    integrator means communicating with said sampling circuit means for integrating said analog signal;
    comparator means communicating with said integrator means for comparing an output signal from said integrator means with a reference signal;
    discharge circuit means including a plurality of capacitors communicating with said integrator means for receiving and transferring charge from and to said integrator means;
    power means communicating with said discharge circuit means; and
    processing means communicating with said discharge circuit means for processing information generated by charging and discharging at least a first capacitor of said plurality of capacitors with an amount of charge to determine a digital representation having a number of digital bits of said analog signal, wherein a total absolute amount of charge transferred relative to said plurality of capacitors including said first capacitor remains substantially the same during each cycle in the determination of digital bits using at least said first capacitor.

2. An apparatus, as claimed in claim 1, wherein:
    said power means is a single source of power used to transfer charge relative to at least said first capacitor.

3. An apparatus, as claimed in claim 1, wherein:
    each of said plurality of capacitors is incorporated on a single chip.

4. An apparatus, as claimed in claim 3, wherein:
    said processing means is incorporated on said single chip.

5. An apparatus, as claimed in claim 1, wherein:
    said processing means includes means for controlling the direction of charge transfers between said integrator means and each of said plurality of capacitors.

6. An apparatus, as claimed in claim 1, wherein:
    said integrator means includes first switch means connected to a first terminal of each of said plurality of capacitors.

7. An apparatus, as claimed in claim 6, wherein:
    said discharge circuit means includes second switch means connected to a second terminal of said first capacitor.

8. An apparatus for providing an analog-to-digital conversion, comprising:
    sampling circuit means for receiving an analog signal;
    integrator means communicating with said sampling circuit means for integrating said analog signal;
    comparator means communicating with said integrator means for comparing an output signal from said integrator means with a reference signal;
    discharge circuit means including a plurality of charge transfer means communicating with said integrator means for receiving and transferring charge;
    power means communicating with said discharge circuit means; and
    processing means communicating with said discharge circuit means for processing information generated by charging and discharging at least a first charge transfer means of said plurality of charge transfer means to determine a digital representation of said analog signal, said first charge transfer means including a switched capacitor wherein charge is transferable between said switched capacitor and said integrator means for more than one clock cycle so that more than one digital bit of information relating to a digital signal can be provided using said switched capacitor and thereby reduce the number of charge transfer means required for a given signal resolution.

9. An apparatus for calibrating circuit elements in an analog-to-digital converter, comprising:

first means for generating a residue of charge on at least a first circuit element of a plurality of circuit elements by transferring charge to and from said first circuit element, said first means including an integrator with which each of said plurality of circuit elements communicates; and second means communicating with said first means for determining an amount which is a function of said residue of charge, said amount corresponding to a fractional offset error, said second means including a calibrator for calibrating each of said plurality of circuit elements using said amount which is a function of said residue of charge.

10. An apparatus, as claimed in claim 9, wherein:
said circuit elements includes capacitors; and
said integrator means includes capacitor means communicable with each of said plurality of capacitors.

11. An apparatus, as claimed in claim 9, wherein:
said integrator means includes capacitor means and said residue of charge is generated by transferring charge to and from said capacitor means.

12. An apparatus, as claimed in claim 9, wherein:
said first means includes a plurality of switches, each of said switches communicating with one terminal of each of said circuit elements.

13. An apparatus, as claimed in claim 9, wherein:
said first means includes switch means providing communication between said integrator means and said circuit elements.

14. An apparatus, as claimed in claim 9, wherein:
each of said circuit elements and at least portions of said second means are incorporated on a single chip.

15. An apparatus, as claimed in claim 10, wherein:
each of said capacitors is connected to a single source of power to transfer charge to and from each of said capacitors.

16. A method for calibrating charge transfer devices in an analog-to-digital converter, comprising:
providing integrator means;
providing a plurality of charge transfer means;
auto-zeroing said integrator means;
determining a fractional offset error of a first charge transfer means of said plurality of charge transfer means, said step of determining including monitoring the number of charge transfers in one direction relative to said first charge transfer means; and
determining calibration constants of said plurality of charge transfer means.

17. A method, as claimed in claim 16, wherein:
said step of determining said fractional offset error includes effecting positive and negative charge transfers between said first charge transfer means and said integrator means.

18. A method, as claimed in claim 16, wherein:
said step of determining said fractional offset error includes using a magnitude which is a function of a number of clock cycles, during which charge is transferred.

19. A method for calibrating charge transfer devices in an analog-to-digital converter, comprising:
providing integrator means;
providing a plurality of charge transfer means;
auto-zeroing said integrator means;
determining a fractional offset error of a first charge transfer means of said plurality of charge transfer means, said step of determining said fractional offset error including successively repeating charge transfers relative to said first charge transfer means a predetermined number of times; and
determining calibration constants of said plurality of charge transfer means.

20. A method for calibrating charge transfer devices in an analog-to-digital converter, comprising:
providing integrator means;
providing a plurality of charge transfer means;
auto-zeroing said integrator means;
determining a fractional offset error of a first charge transfer means of said plurality of charge transfer means as a function of a magnitude which is a function of the number of charge transfers in one direction, a magnitude which is a function of the total number of charge transfers, and a magnitude which is a function of the number of clock cycles during which charge transfers occur to calculate said fractional offset error; and
determining calibration constants of said plurality of charge transfer means.

21. A method for calibrating charge transfer devices in an analog-to-digital converter, comprising:
providing integrator means;
providing a plurality of charge transfer means;
auto-zeroing said integrator means;
determining a fractional offset error of a first charge transfer means of said plurality of charge transfer means; and
determining calibration constants of said plurality of charge transfer means, said step of determining calibration constants including making the determination in a sequence that uses charge transfer means having increasing magnitudes of capacitance.

22. A method for calibrating charge transfer devices in an analog-to-digital converter, comprising:
providing integrator means;
providing a plurality of charge transfer means;
auto-zeroing said integrator means;
determining a fractional offset error of a first charge transfer means of said plurality of charge transfer means; and
determining calibration constants of said plurality of charge transfer means, said step of determining calibration constants including determining positive and negative error constants for each of said charge transfer means and summing each of said positive and negative error constants.

23. A method for calibrating charge transfer devices in an analog-to-digital converter, comprising:
providing integrator means;
providing a plurality of charge transfer means;
auto-zeroing said integrator means;

determining a fractional offset error of a first charge transfer means of said plurality of charge transfer means; and determining calibration constants of said plurality of charge transfer means, said step of determining calibration constants including determining positive charge transfers between a second charge transfer means and said integrator means and effecting negative charge transfers between said first charge transfer means and said integrator means to establish a residue that is indicative of the deviation of positive charge transfer of said second charge transfer means from an expected value.

24. A method for converting an analog signal to a digital signal, comprising:

providing integrator means;

providing a plurality of charge transfer means;

supplying charge relating to an analog signal using said integrator means;

transferring a known amount of charge between at least a first charge transfer means and said integrator means, said step of transferring being repeated a predetermined number of times; and converting the analog signal to a digital signal using information obtained as a result of said transferring step, said step of converting including counting the number of charge transfers between said integrator means and said first charge transfer means.

25. A method, as claimed in claim 24, wherein:

said step of providing a plurality of charge transfer means includes incorporating each of said charge transfer means on a single chip.

26. A method, as claimed in claim 24, wherein:

said transferring step includes using a single source of power to selectively transfer charge in a selected one of two directions.

* * * * *